US006730554B1

(12) United States Patent
Baldwin et al.

(10) Patent No.: US 6,730,554 B1
(45) Date of Patent: May 4, 2004

(54) MULTI-LAYER SILICIDE BLOCK PROCESS

(75) Inventors: Greg C. Baldwin, Plano, TX (US); Freidoon Mehrad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/301,246

(22) Filed: Nov. 21, 2002

(51) Int. Cl.[7] .......................................... H01L 21/8238
(52) U.S. Cl. ........................ 438/210; 438/381; 438/382
(58) Field of Search ................................. 438/210, 200, 438/238, 381, 382, 383, 384, 385

(56) References Cited

U.S. PATENT DOCUMENTS 5,304,502 A * 4/1994 Hanagasaki .................. 438/210

* cited by examiner

Primary Examiner—Jack Chen
(74) Attorney, Agent, or Firm—Peter K. McLarty; W. James Brady, III; Frederick J. Telecky, Jr.

(57) ABSTRACT

An integrated circuit resistor (170) is formed on an isolation dielectric structure (20) formed in a semiconductor (10). A patterned silicon nitride layer (125) and an optional patterned silicon oxide layer (135) is formed on the surface of the resistor polysilicon layer (40) that functions to mask the surface of the integrated circuit resistor (170) during the formation of metal silicide regions (160) on the integrated circuit resistor (170).

11 Claims, 2 Drawing Sheets

MULTI-LAYER SILICIDE BLOCK PROCESS

CROSS-REFERENCE TO RELATED PATENT/PATENT APPLICATIONS

The following co-assigned pending patent applications are hereby incorporated by reference:

| Patent No./Serial No. | Filing Date | TI Case Number | Inventors |
| --- | --- | --- | --- |
| 10/301,024 | November 21, 2002 | TI-34761 | Baldwin et al. |

FIELD OF THE INVENTION

The present invention relates to a method for forming an integrated circuit polysilicon resistor using a multi-layer silicide block process.

BACKGROUND OF THE INVENTION

Mixed signal integrated circuits often require resistors for proper circuit operation. Typically such resistors are formed using doped polycrystalline silicon. Metal oxide semiconductor (MOS) transistors, which are also present on the mixed signal integrated circuits, have a gate electrode that also comprises polycrystalline silicon. To lower the resistances present in the MOS transistor a metal silicide layer is formed on the polysilicon gate electrode of the MOS transistor. Metal silicide layers are also formed on the source and drain regions of the MOS transistor. In order for the integrated circuit resistors to have the desired resistance values in the limited space available it is important that no metal silicide be formed on the surface of the resistors. In addition to the resistance value it is important that the resistors exhibit a low thermal coefficient of resistance allowing proper circuit operation over a wide range of temperature values. The integrated circuit resistor thermal coefficient of resistance depends on the doping concentration and it is important that the polysilicon resistor be formed using the proper dopant concentration. Using current integrated circuit manufacturing methods, the integrated of polysilicon resistors with the above properties often requires the addition of expensive processing steps that have a deleterious effect on the performance of the MOS transistors. There is therefore a need for a method to form integrated circuit resistors with the above described properties without adding expensive steps to existing manufacturing processes. The instant invention addresses this need and presents a method for forming an integrated circuit polysilicon resistor using a multi-layer silicide block process.

SUMMARY OF INVENTION

The instant invention describes a method for forming an integrated circuit resistor. In particular the method comprises forming an insulator region in a semiconductor. A dielectric layer is then formed on the insulator and polysilicon layers are simultaneously formed on the dielectric layer and the insulator layer. The polysilicon layer formed on the dielectric layer will function as the MOS transistor gate structure and the polysilicon layer formed on the dielectric layer will function as the polysilicon resistor. Both polysilicon layers are implanted either during the formation of either the p-type source drain regions of the PMOS transistors or the n-type source drain regions of the NMOS transistors. A patterned silicon nitride layer and an optional patterned silicon oxide layer are formed on the surface of the resistor polysilicon layer. A metal silicide is then formed on the surface of the resistor polysilicon layer not covered by the patterned silicon nitride layer.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

The instant invention will be described using a MOS transistor and an integrated circuit resistor shown in FIGS. 1(a) to 1(f). It is not intended that the invention be limited to the case of a single MOS transistor and resistor. The instant invention can be used to form integrated circuit resistors in combination with any number of MOS transistors and any other necessary integrated circuit device or structure.

Figure 1A:
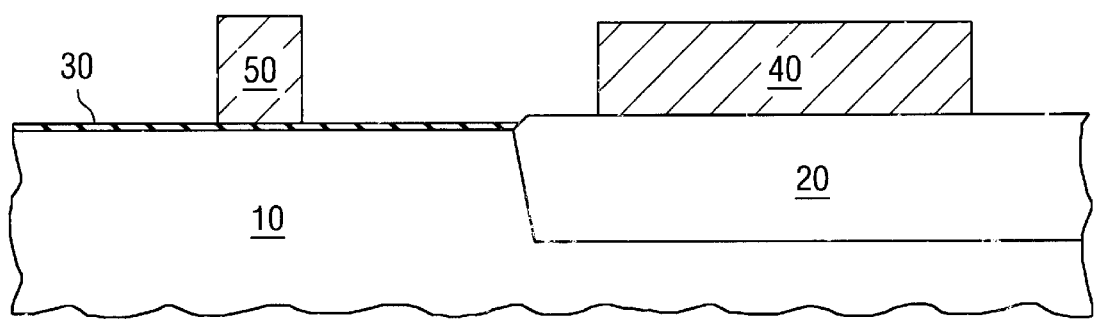
FIGS. 1(a)–1(f) are cross-sectional diagrams showing an to embodiment of the instant invention.

An isolation region 20 is formed in a semiconductor 10 as shown in FIG. 1(a). The isolation region comprises a shallow trench isolation (STI) structure formed using known semiconductor processing methods. In an embodiment the STI structure comprises silicon oxide but any suitable insulator material can be used to form the isolation structure 20. In addition to STI other isolation structures such as localized oxidation (LOCOS) can be used to form the isolation region 20 shown in FIG. 1(a). A dielectric layer 30 is formed on the surface of the semiconductor 10. The dielectric layer is about 8 to 150 angstroms thick and more preferably between 10 and 45 angstroms thick. The dielectric layer can be formed using silicon oxide, silicon nitride, silicon oxynitride, any combination of these materials, or any other suitable dielectric material. In addition high k dielectrics such as $HfO_2$, $ZrO_2$, $Al_2O_3$, silicates, aluminates, HfSiON, any combination of these materials, or any other suitable high K dielectric can also be used to form the dielectric layer 30. Following the formation of the dielectric layer 30, a blanket polycrystalline silicon (herein after polysilicon) layer is formed and patterned resulting in the polysilicon layers 40 and 50 shown in FIG. 1(a). The polysilicon layers 40 and 50 are preferably between 600 and 2500 angstroms thick. The MOS transistor gate will be formed using polysilicon layer 50 and the integrated circuit resistor will be formed using polysilicon layer 40.

Figure 1B:
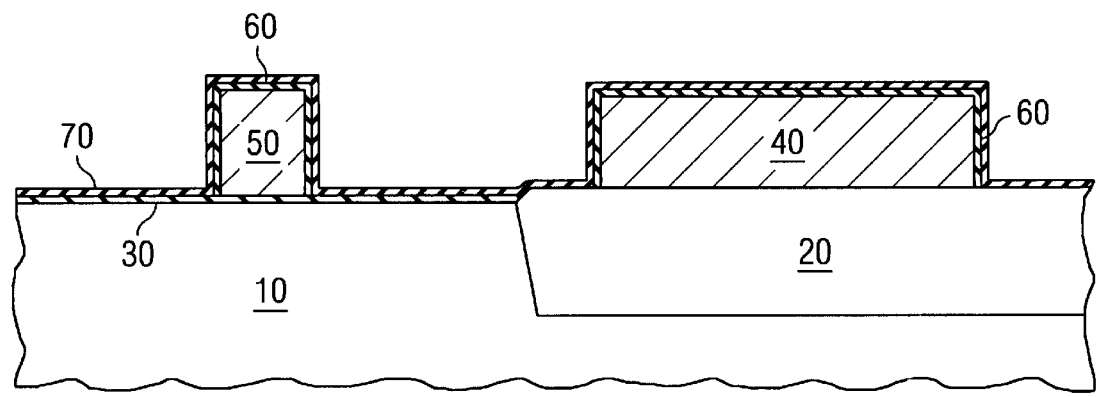

A polysilicon oxidation process is performed to form the silicon oxide layer 60 shown in FIG. 1(b). The silicon oxide layer 60 is between 5 and 60 Angstroms thick and is formed using known polysilicon oxidation methods. A silicon nitride layer 70 is formed on the structure as shown in FIG. 1(b). The silicon nitride layer is formed using known methods and is preferably between 30 and 120 angstroms thick.

Figure 1C:
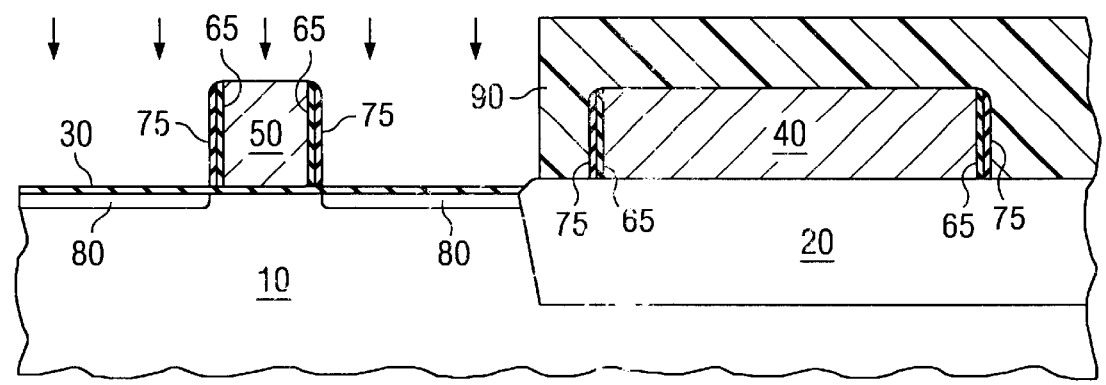

An anisotropic etch is performed on the silicon nitride layer 70 and the silicon oxide layer 60 to form the spacer structures 65 and 75 shown in FIG. 1(c). The anisotropically etched silicon oxide layer 60 forms the silicon oxide spacer structure 65 and the anisotropically etched silicon nitride layer 70 forms the silicon nitride spacer structure 75. The spacer structures 65 and 75 are formed adjacent to the transistor gate polysilicon layer 50 and the resistor polysilicon layer 40. Following the formation of the spacer structures 65 and 75, and prior to the formation of the drain and source extension regions 80, a photoresist layer 90 is formed over the resistor polysilicon layer 40. The photoresist layer 90 will block the implanted dopant species that will be used to form the extension regions 80. It should be noted that the photoresist layer 90 is also used to block the implanted species from entering the complementary MOS transistor type. Therefore if the extension regions of the NMOS transistors are being implanted the photoresist layer 90 will block the PMOS transistors and vice versa. Following the formation of the photoresist layer 90, dopant species are implanted into the semiconductor 10 to form the drain and source extension regions 80. The ion implant processes used to form the extension regions comprise the lightly doped drain (LDD) implants, pocket implants, and any other implantation processes necessary to form the MOS transistor. The implantation processes will comprise both n-type and/or p-type dopant species. The photoresist layer 90 will block any of these implanted dopant species from entering the resistor polysilicon layer 40.

Figure 1D:
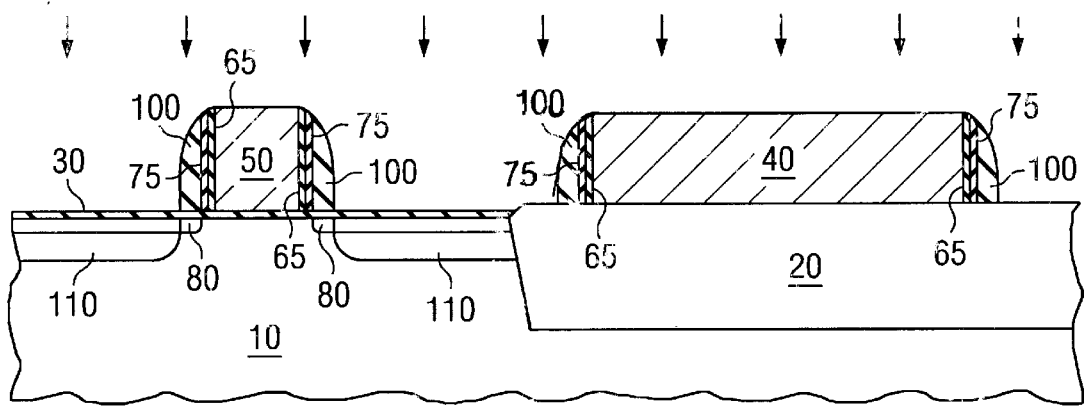

Sidewall structures 100 are formed adjacent to the spacer structures 65 and 75 following the formation of the extension regions 80 and removal of the photoresist layer 90 as shown in FIG. 1(d). The sidewall structures 100 can comprise silicon nitride, silicon oxynitride, silicon oxide, or any combination of these materials either as mixed materials or alternating layers. The sidewall structures are formed by first forming blanket layers of the material (or materials) which will comprise the sidewall structure 100. The blanket layers so formed are then etched using an anisotropic etch process resulting in the sidewall structures 100. Following the formation of the sidewall structures 100, the MOS transistor source and drain regions 110 are formed by implanting dopant species into the Semiconductor 10 as shown in FIG. 1(d). For an n-channel MOS transistor n-type dopant species such as arsenic and or phosphorous are implanted into the semiconductor to form n-type source and drain regions 110. For a p-channel MOS transistor p-type dopant species such as boron are implanted into the semiconductor to form p-type source and drain regions 110. In either case the implanted species used to form the source and drain regions 110 are also simultaneously used to dope the resistor polysilicon layer 40 n-type or p-type. In the case where n-type dopants are used to form n-type source and drain regions 110, the n-type dopants are also used to simultaneously dope the resistor polysilicon layer 40 n-type. In an embodiment of the instant invention implant doses of $1 \times 10^{13}$ cm$^2$ to $1 \times 10^{16}$ cm$^2$ of phosphorous and arsenic species are used simultaneously to form n-type source and drain regions 110 and dope the resistor polysilicon structure 40 n-type. In the case where p-type source and drain regions are formed boron species can be simultaneously implanted into the semiconductor 10 and the resistor polysilicon layer 40 at doses between $3 \times 10^{14}$ cm$^2$ to to $3 \times 10^{16}$ cm$^2$. Therefore the resistor polysilicon layer 40 can be doped either n-type or p-type.

Figure 1E:
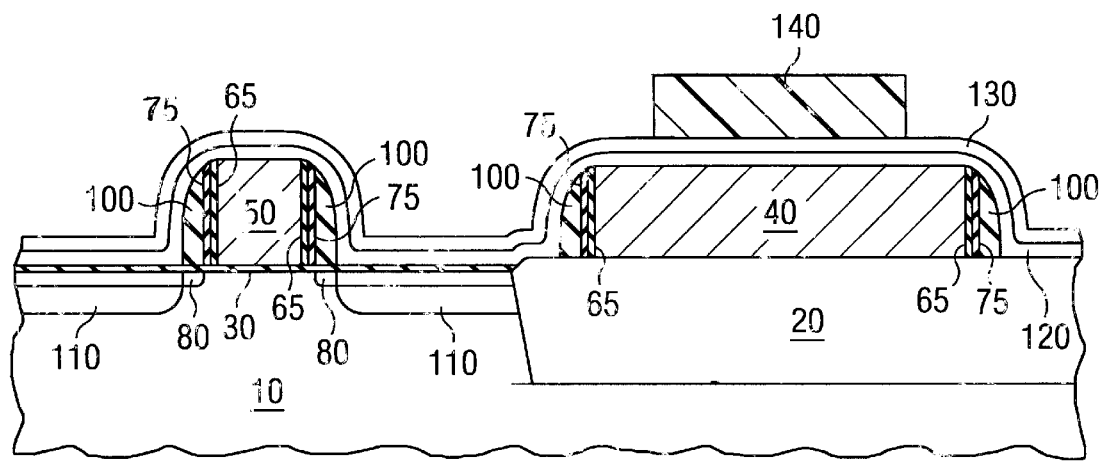

Following the formation of the MOS transistor source and drain regions 110, a silicon nitride layer 120 is formed over the structure of FIG. 1(d) as shown in FIG. 1(e). The silicon nitride layer 120 is formed using known methods and is preferably between 50 and 150 angstroms thick. An optional silicon oxide layer 130 can be formed over the silicon nitride layer 120. The silicon oxide layer can be formed using chemical vapor deposition (CVD) and is preferably between 75 to 500 angstroms thick. A patterned photoresist layer 140 is formed above the resistor polysilicon layer 40 to mask a portion of the underlying silicon nitride layer 120 and optional silicon oxide layer 130 during the subsequent etch processes.

Figure 1F:
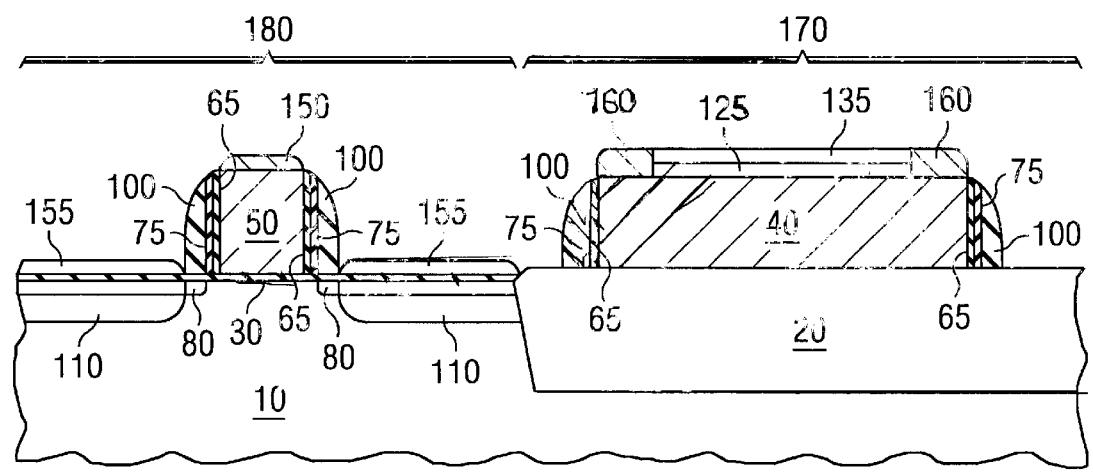

Following the formation of the patterned photoresist layer 140, the exposed regions of the optional silicon oxide layer 130 and the underlying silicon nitride layer are etched leaving the patterned silicon oxide layer 135 and the patterned silicon nitride layer 125 on the upper surface of the resistor polysilicon structure 40 as shown in FIG. 1(f). The exposed regions of the optional silicon oxide layer 130 can be etched using a buffered hydrofluoric acid etch. The exposed regions of the silicon nitride layer 120 are then etched using plasma based etch processes. After the resist is removed, an HF dip and pre-sputter etch is used to remove any remaining native or chemical oxide on the silicon regions that are to be silicided. The optional oxide layer can be included to reduce or prevent any thinning of the nitride layer over the poly resistor. The metal silicide regions 150, 155, and 160 are formed following the formation of the patterned optional silicon oxide layer 135 and the patterned silicon nitride layer 125 as shown in FIG. 1(f). The metal silicide regions 150, 155, and 160 are formed by first forming a blanket metal layer over the structure. The metal used to form the blanket metal layer can comprise titanium, cobalt, tungsten, nickel, or any other suitable metal. Following the formation of the blanket metal layer, the metal is reacted with the underlying exposed silicon regions of the gate polysilicon layer 50, the source and drain regions 110, and the resistor polysilicon layer 40. The reaction between the metal layer and the underlying silicon is initiated by heating the structure above a certain critical temperature. In an embodiment where the metal formed comprises cobalt, the structure is heated to a temperature greater than 500° C. Following the reaction between the metal layer and the underlying silicon the un-reacted metal is removed using a chemical etch (or strip) process. For the embodiment where cobalt is reacted with the underlying silicon to form a cobalt silicide, SPM can be used in the chemical etch process to remove the un-reacted cobalt, followed by SC1 to remove particles. Following the chemical etch process an anneal is performed by heating the silicide structures to temperatures greater than 680° C. The resulting fully formed metal silicide regions 150, 155, and 160 are shown in FIG. 1(f). The patterned silicon nitride layer 125 and the optional patterned silicon oxide layer 135 will block the formation of a metal silicide in those regions of the resistor polysilicon layer 40 covered by the layers 125 and 135. The integrated circuit resistor 170 comprises the doped resistor polysilicon layer 40, the patterned silicon nitride layer 125 the optional patterned silicon oxide layer 135, and the metal silicide regions 160. Electrical contact to the integrated circuit resistor 170 is made through the metal silicide regions 160. Electrical contact to the MOS transistor 180 is made through the gate 50 and the source drain 110 metal silicide regions 150 and 155 respectively.

Thus while this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming an integrated circuit resistor, comprising:

forming an insulator region in a semiconductor;

forming a polysilicon layer with an upper surface on said insulator region;

forming a first silicon nitride layer over said polysilicon layer;

forming sidewall structures adjacent said polysilicon layer;

simultaneously implanting said polysilicon layer and source and drain regions of a MOS transistor with dopant species;

forming a second silicon nitride layer over said polysilicon layer;

forming a patterned silicon nitride layer on said polysilicon layer from said second silicon nitride layer; and forming a metal silicide on the surface of the polysilicon layer not covered by the patterned silicon nitride layer.

2. The method of claim 1 wherein said simultaneously implanting comprises implanting said source and drain regions and said polysilicon layer with phosphorous ions at implant doses of $1\times10^{13}$ cm$^2$ to $1\times10^{16}$ cm$^2$.

3. The method of claim 2 wherein said simultaneously implanting comprises implanting said source and drain regions and said polysilicon layer with arsenic ions at implant doses of $1\times10^{13}$ cm$^2$ to $1\times10^{16}$ cm$^2$.

4. The method of claim 1 wherein said simultaneously implanting comprises implanting said source and drain regions and said polysilicon layer with boron species at implant doses of $3\times10^{14}$ cm$^2$ to $3\times10^{16}$ cm$^2$.

5. The method of claim 1 wherein said forming a metal silicide on the surface of the polysilicon layer comprises forming a cobalt or nickel silicide.

6. The method of claim 1 further comprising forming a patterned silicon oxide layer on said patterned silicon nitride layer.

7. A method for forming an integrated circuit resistor, comprising:

forming an insulator region in a semiconductor;

forming a polysilicon layer with an upper surface on said insulator region;

forming a first silicon nitride layer over said polysilicon layer;

forming sidewall structures adjacent said polysilicon layer;

simultaneously implanting said polysilicon layer and source and drain regions of a MOS transistor with phosphorous ions at implant doses of $1\times10^{13}$ cm$^2$ to $1\times10^{16}$ cm$^2$.

forming a second silicon nitride layer over said polysilicon layer;

forming a silicon oxide layer on said second silicon nitride layer;

forming a patterned silicon nitride layer on said polysilicon layer from said second silicon nitride layer;

forming a patterned silicon oxide layer on said patterned silicon nitride layer from said silicon oxide layer;

forming a metal silicide on the surface of the polysilicon layer not covered by the patterned silicon nitride layer.

8. The method of claim 7 wherein said forming a metal silicide on the surface of the polysilicon layer comprises forming a cobalt or nickel silicide.

9. The method of claim 7 wherein said forming a metal silicide on the surface of the polysilicon layer comprises forming a titanium silicide.

10. The method of claim 7 wherein said simultaneously implanting comprises further implanting said source and drain regions and said polysilicon layer with arsenic ions at implant doses of $1\times10^{13}$ cm$^2$ to $1\times10^{16}$ cm$^2$.

11. The method of claim 7 wherein said simultaneously implanting comprises further implanting said source and drain regions and said polysilicon layer with boron ions at implant doses of $3\times10^{14}$ cm$^2$ to $3\times10^{16}$ cm$^2$.

* * * * *